US010945353B2

(12) United States Patent
Faneuf et al.

(10) Patent No.: US 10,945,353 B2
(45) Date of Patent: Mar. 9, 2021

(54) MECHANISM WITH FOLDED WRAPPING TO SEAL COMPONENTS IMMERSED IN COOLANT

(71) Applicant: Intel Corporation, Santa Clara, CA (US)

(72) Inventors: Barrett M. Faneuf, Beaverton, OR (US); Annie Chen, Portland, OR (US); Jessica Gulbrand, Forest Grove, OR (US); Devdatta P. Kulkarni, Portland, OR (US); Kristin L. Weldon, Hillsboro, OR (US); Joseph Andrew Broderick, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 655 days.

(21) Appl. No.: 15/711,468

(22) Filed: Sep. 21, 2017

(65) Prior Publication Data

US 2019/0090344 A1    Mar. 21, 2019

(51) Int. Cl.
*H05K 7/20* (2006.01)
*H05K 1/02* (2006.01)
(Continued)

(52) U.S. Cl.
CPC ....... *H05K 7/20272* (2013.01); *H05K 1/0203* (2013.01); *H05K 1/18* (2013.01);
(Continued)

(58) Field of Classification Search
CPC .......... H05K 7/20236; H05K 7/20272; H05K 7/20409; H05K 7/20418; H05K 7/20772;
(Continued)

(56) References Cited

U.S. PATENT DOCUMENTS 6,996,953 B2 *  2/2006  Perreault .............. G08B 13/128
                                                        206/706
7,007,171 B1    2/2006  Butturini et al.
                        (Continued)

FOREIGN PATENT DOCUMENTS

JP         WO2017138341 A1 *  8/2018  ............... H05K 7/20

OTHER PUBLICATIONS

International Search Report and Written Opinion dated Dec. 19, 2018 for International Patent Application No. PCT/US2018/047296, 10 pages.

*Primary Examiner* — Zachary Pape
(74) *Attorney, Agent, or Firm* — Schwabe, Williamson & Wyatt, P.C.

(57) ABSTRACT

Embodiments described herein may include apparatuses, systems and/or processes to provide a mechanism with a folded wrapping to mate with a circuit board and a heatsink to enclose and seal a volume between the circuit board and the heatsink. The mechanism with the folded wrapping may be dimensioned to enclose and seal the volume with the volume having a size to accommodate one or more processors to be disposed within the volume, electrically coupled to the circuit board and thermally coupled to the heatsink. On enclosing and sealing the volume, the mechanism with the folded wrapping may keep coolant from reaching the one or more processors when the circuit board, the mechanism, and the heatsink are immersed in the coolant. Other embodiments may be described and/or claimed.

23 Claims, 10 Drawing Sheets

(51) Int. Cl.
  *H01L 23/44* (2006.01)
  *H05K 3/22* (2006.01)
  *H05K 1/18* (2006.01)

(52) U.S. Cl.
  CPC ........... *H05K 3/22* (2013.01); *H05K 7/20236* (2013.01); *H05K 7/20772* (2013.01); *H01L 23/44* (2013.01)

(58) Field of Classification Search
  CPC ........... H05K 1/0203; H05K 2201/062; H05K 2201/066; H01L 23/433; H01L 23/44
  See application file for complete search history.

(56) References Cited

U.S. PATENT DOCUMENTS

| | | | |
|---|---|---|---|
| 8,279,606 B2 * | 10/2012 | Kyle | H01R 12/7076 361/709 |
| 9,392,734 B1 | 7/2016 | Kelley et al. | |
| 2003/0142482 A1 | 7/2003 | Forte et al. | |
| 2016/0143189 A1 | 5/2016 | Campbell et al. | |
| 2016/0360610 A1 | 12/2016 | Salle | |

* cited by examiner

MECHANISM WITH FOLDED WRAPPING TO SEAL COMPONENTS IMMERSED IN COOLANT

FIELD

Embodiments of the present disclosure generally relate to the fields of computing and electronic systems and thermal management. More specifically, embodiments of the present disclosure relate to immersion-cooling of components in a computing or electronic system.

BACKGROUND

As components of computing or electronic systems decrease in size and increase in power requirements as well as thermal dissipation, cooling individual components as well as collections of components will become increasingly important to ensure proper system function moving forward. For example, the size of central processing unit (CPU) dies are miniaturizing at the same time the number of cores, heat dissipation, and thermal design power (TDP) of these dies are increasing. This can result in a higher heat flux from the CPU dies and increase the challenge for thermally managing the CPU.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments described herein may include apparatuses, systems and/or processes to provide a mechanism with a folded wrapping to mate with a circuit board and a heatsink to enclose and seal a volume between the circuit board and the heatsink. The mechanism may be dimensioned to enclose and seal a volume having a size to accommodate one or more processors to be disposed within the volume, the processors to be electrically coupled to the circuit board and thermally coupled to the heatsink. When enclosing and sealing the volume, the mechanism may keep coolant from reaching the one or more processors when the circuit board, the mechanism, and the heatsink are immersed in the coolant. Additionally, a sealing cap may be dimensioned to overlap an edge surrounding the heatsink and secure an opening of the mechanism to the heatsink. Also, an extended sealing surface, with interlocking tabs, may be fastened and sealed to the mechanism to facilitate assembly of the heatsink, circuit board, and mechanism.

In embodiments, the mechanism described above may allow a unit consisting of one or more processors that are electrically coupled to a circuit board and thermally coupled to a heatsink and sealed inside the mechanism to be cooled by immersing the unit into coolant. This immersion cooling may enable an increase in computing density by increasing the number of processors within a computing resource, e.g., a computing resource within a computing rack in a data center, where the computing resources within the computer rack are generally cooled using existing air cooling or cold plate cooling designs. Otherwise, using existing air cooling or cold plate cooling designs in conjunction with immersion cooling may increase the failure rate of the components being immersion cooled. For example, to expose solvent-based coolant directly to the one or more processors, to sockets, to the package sealant, or to thermal interface materials (TIM) that may be thermally coupled to the package, may result in corrosion in these components. This may result in failed processors and/or premature downward throttle of processors' operating frequencies.

In embodiments, the folded wrapping, which may be sealed to a circuit board and a sealing cap designed to close off fluid ingress through irregular features and openings on typical existing air-cooled heatsink designs, may keep coolant from reaching the enclosed/sealed processors or other components. This way, the enclosed/sealed processors may be cooled while preventing direct contact with the cooling fluid, and with no requirement to change the existing loading mechanisms, thermal solutions, sockets, circuit board assemblies. Similarly, no change to the CPU package may be required.

The folded wrapping may be a flexible component adaptable to multiple mechanical architectures. Implementations of this folded wrapping technique may result in lower cost transition to immersion cooling, greater ease of manufacture, and the ability to tune various immersion coolants and adapt with different sealant and/or folded wrapping material selection. It may also allow replacing the electrical insulator between the printed circuit board and the loading mechanism, provide adaptability to multiple architectures, and enable low-cost immersion specific heat integration with existing PCB designs and retention technologies.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical, thermal or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements or devices are thermally coupled. By way of example and not limitation, "coupled" may mean two or more elements/devices cooperate and/or interact. By way of example and not limitation, a computing apparatus may include two or more computing devices "coupled" on a motherboard or by one or more network linkages.

Figure 1:
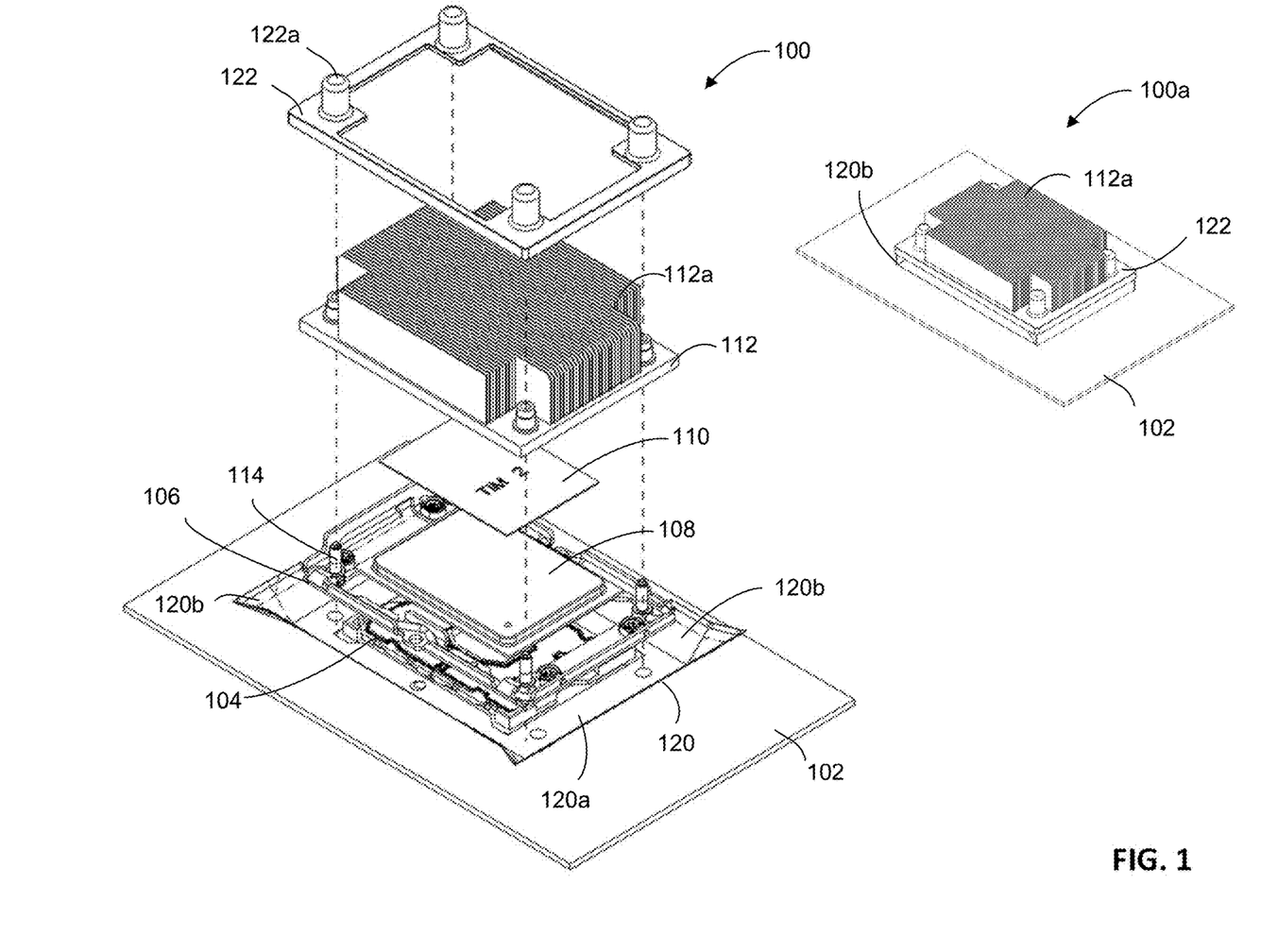
FIG. 1 is an exploded view of a mechanism to seal components from immersion coolant, in accordance with various embodiments.

FIG. 1 is an exploded view of a mechanism to seal components from immersion coolant, in accordance with various embodiments. Diagram 100 may be an explosion of diagram 100a that includes a sealing cap 122 placed over a heatsink 112 that is sealing part of a folded wrapping 120b that has created a sealed volume that may surround components (e.g. a processor) coupled to a printed circuit board (PCB) 102.

Turning to diagram 100, a PCB 102 may be physically and/or electrically coupled with one or more central processing unit (CPU) sockets 104. A retention/loading mechanism 106 may be coupled with the sockets 104 and the circuit board 102, and may be used to secure and to couple a CPU package 108 to the circuit board 102. In embodiments, a thermal interface material (TIM) 110 may be thermally coupled to the CPU 108, to facilitate heat transfer to a heatsink 112. The heatsink 112, in embodiments, may have an air-cooled design having a plurality of fins 112a to facilitate thermal dissipation. Pins 114 may be used to secure the assembly including the retention/loading mechanism 106, CPU 108, TIM 110, and/or heatsink 112 to the PCB 102. In embodiments, the pins 114 may be part of spring-loaded mounting hardware. In embodiments, PCB 102 may be a motherboard.

A folded wrapping 120 may be placed between the circuit board 102 and the retention/loading mechanism 106. This placement may be in the form of a sealed contact. This may assist in preventing coolant (not shown) from entering between the circuit board 102 and a first end of the wrapping mechanism 120a that may be sealed to the PCB 102. A second end of the folded wrapping 120b may be sealed to the heatsink 112 (described further below). This way, when assembled as shown in diagram 100a, and sealed using embodiments that may be described below, the circuit board 102, folded wrapping 120, and heatsink 112 may form a volume that may keep coolant from entering the volume when the assembly 110a is immersed in coolant. In this way, the enclosed/sealed components will not experience the electrical or corrosive effects of the coolant.

In embodiments, the folded wrapping 120 may be made of flexible material and may be folded to position its surfaces for sealing at appropriate surfaces of the PCB 102 and the heatsink 112. The folded wrapping 120 may be made of materials compatible with coolant fluid used. They material may include, but is not limited to, plastic polymers, metal foils, coated polymer materials, or other materials that may not be dissolved or permeated by the coolant fluid used. The material should also be flexible enough to be folded without causing a breach in the material along the folding line. In embodiments, the folded wrapping 120 may be manufactured as a flat part with pre-creased folds for easy assembly, or may be injection-molded in a desired shape, depending upon the flexibility of the material selected. The folded wrapping 120 may be sealed using a dispensed curing sealant or adhesive sealant.

In embodiments, the sealant may include a two-part epoxy adhesive/sealant that may cure after mixing and/or with heat applied, may adhere to surfaces, conform to small geometries, and fill/seal openings. This type of adhesive/sealant may be chemically resistant to certain coolant types under consideration, but the sealant may not be as flexible as other sealant options. Flexibility of joints, for example, may be obtained through selection of folded wrapping material. In embodiments, this epoxy sealant may also be a thermal epoxy (two-part epoxy with additives to enhance thermal conductivity), to improve thermal conductivity between the heatsink and components interacting with the coolant fluid such as the folded wrapping or printed circuit board.

In embodiments, the sealant may include a single part (e.g. silicone) sealant that may cure with exposure to air and/or heat, adhere to surfaces, conform to small geometries and fill/seal openings. This type of sealant may be selected for use with coolant fluids which will not dissolve or compromise sealing attributes and may be flexible, to allow conformity between metal or hard plastic components. For all sealant types, the sealant may be pre-applied to folded wrapping and/or heatsink surfaces with a protective liner. This may allow for dispensing of sealant in a streamlined and/or automated way that may be performed in location. This may provide for higher-quality application of sealant onto surfaces and parts.

In embodiments, a sealing cap 122 may be used to secure the second end of the folded wrapping 102b to facilitate a secure seal between the folded wrapping 120 and the heatsink 112. In embodiments, the sealing cap 122 may be designed specifically to conform to the geometry of the heatsink 112. For example, this may include a sealing cap encapsulation feature 122a that may receive a portion of pin 114. When applied, the sealing cap 122 may compress the folded wrapping 102 to the heatsink 112 to form a coolant-tight seal.

In embodiments, instead of a heatsink 112 with fins, a cold plate (not shown) may be used instead where coolant may be pumped to the cold plate to thermally dissipate heat from the CPU 108 or other components. The cold plate (not shown) may otherwise mechanically integrate with the heatsink 112 as described above.

Figure 2:
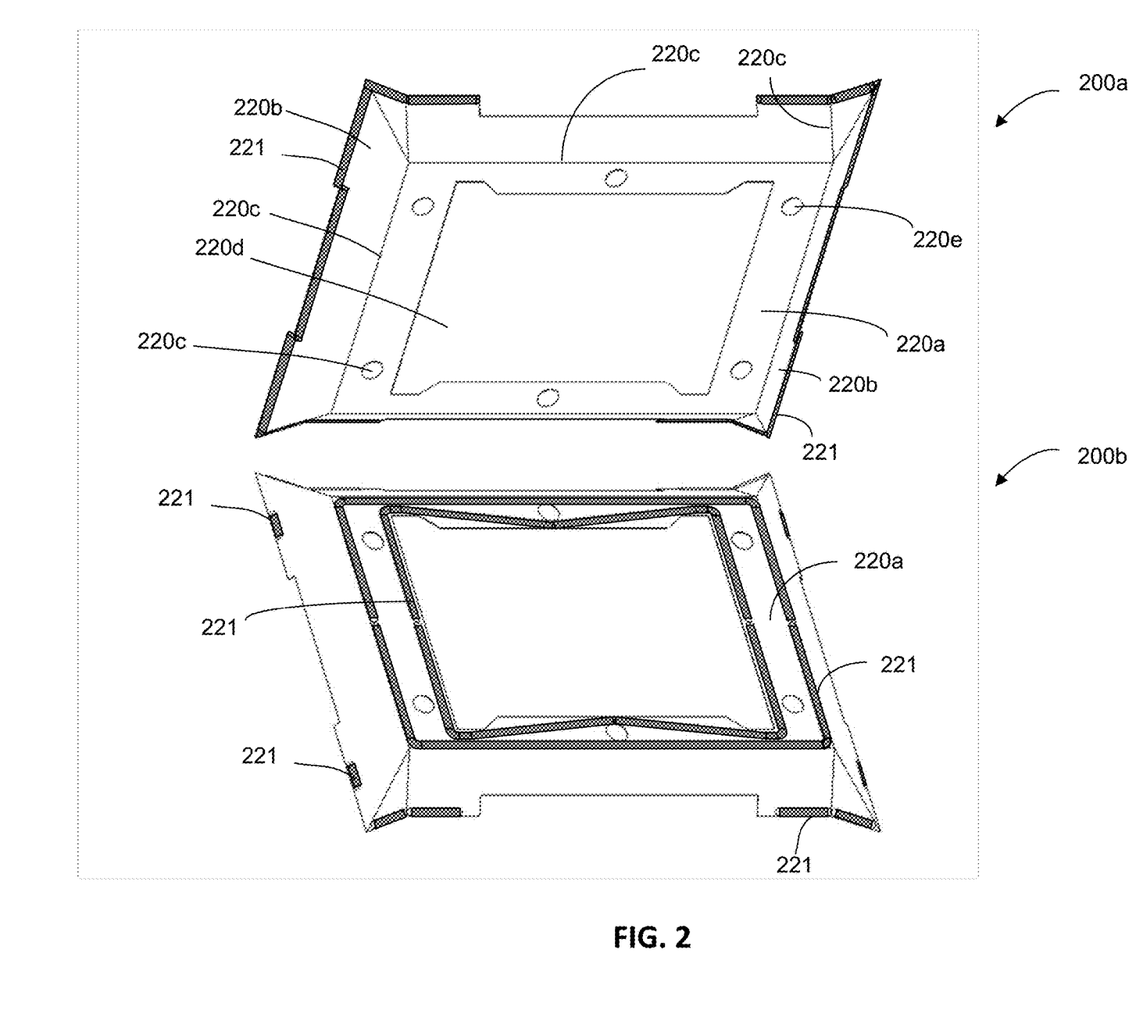
FIG. 2 is a top and a bottom perspective view of a folded wrapping to meet with a circuit board and the heatsink, in accordance with various embodiments.

FIG. 2 is a top and a bottom perspective view of a folded wrapping to meet with a circuit board and the heatsink, in accordance with various embodiments. Diagram 200a shows a top down perspective view of a folded wrapping 220, which may be similar to folded wrapping 120 of FIG. 1. Pre-creased folds 220c may facilitate the conversion of the second end of the wrapping mechanism 220b to sides that may conform to a coolant-free volume, such as shown in 120b of diagram 100a.

In embodiments, a cutout 220d may facilitate creating an open area for the wrapping to fit over the socket 104 and/or retention/loading mechanism 106. In embodiments, the geometry of the cutout may replicate electrical insulator geometry and/or replace the electrical insulator (not shown). The electrical insulator may be used to protect the printed circuit board from mechanical damage and electrical shorting risks posed by the metal frame of the retention/loading mechanism 106 of FIG. 1. The electrical insulator may be a flat sheet of electrically resistive plastic, e.g. Formex, of a thickness from 0.1 to 0.25 mm. The electrical insulator may be cut into a shape corresponding to the retention/loading mechanism 106 frame footprint, plus an overhang of ~0.25-0.5 mm, to ensure that no part of the metal frame may contact the printed circuit board. The electrical insulator may have holes and cutouts corresponding to mechanical features passing through the board (e.g. mounting screws), and for critical board components, (e.g. CPU socket 104). The electrical insulator is often manufactured with adhesive on the side facing the retention/loading mechanism, such that it may be pre-assembled to the retention/loading mechanism assembly and simplify system integration. Holes 220e may be cut out to allow for fasteners that may be used by the PCB 102.

A sealant 221 may be applied to the edges to facilitate securing the folded wrapping 220 when folded into a shape to create at least a part of the volume. This sealant 221 may facilitate sealing with heatsink 112 surfaces and with folded wrapping surfaces.

Diagram 200b shows a bottom up perspective of the folded wrapping 220. Sealant 221 may be applied to the first part of the folded wrapping 220a, which may also be referred to as a folded wrapping gasket, that may couple and seal to the PCB 102. This sealant may form a barrier against coolant fluid penetrating under the loading/retention mechanism 106. In embodiments, the first part of the folded wrapping 220a may be assembled to the loading/retention mechanism 106 prior to installation with the PCB 102. This may be similar to legacy applications that have an electrical insulator as part of a sub component of the loading/retention mechanism 106.

In embodiments, the loading/retention mechanism 106 may be assembled to the PCB 102 in a legacy fashion. Sealant may be applied to mounting screws, studs, and/or back-plate surfaces (not shown) of the PCB 102 to ensure that coolant fluid may not penetrate through mounting hardware features of the PCB 102. In embodiments, after the retention/loading mechanism 106 may be installed, the CPU 108 may be installed, the TIM 110 may be installed, and in the heatsink 112 may be installed.

Figure 3:
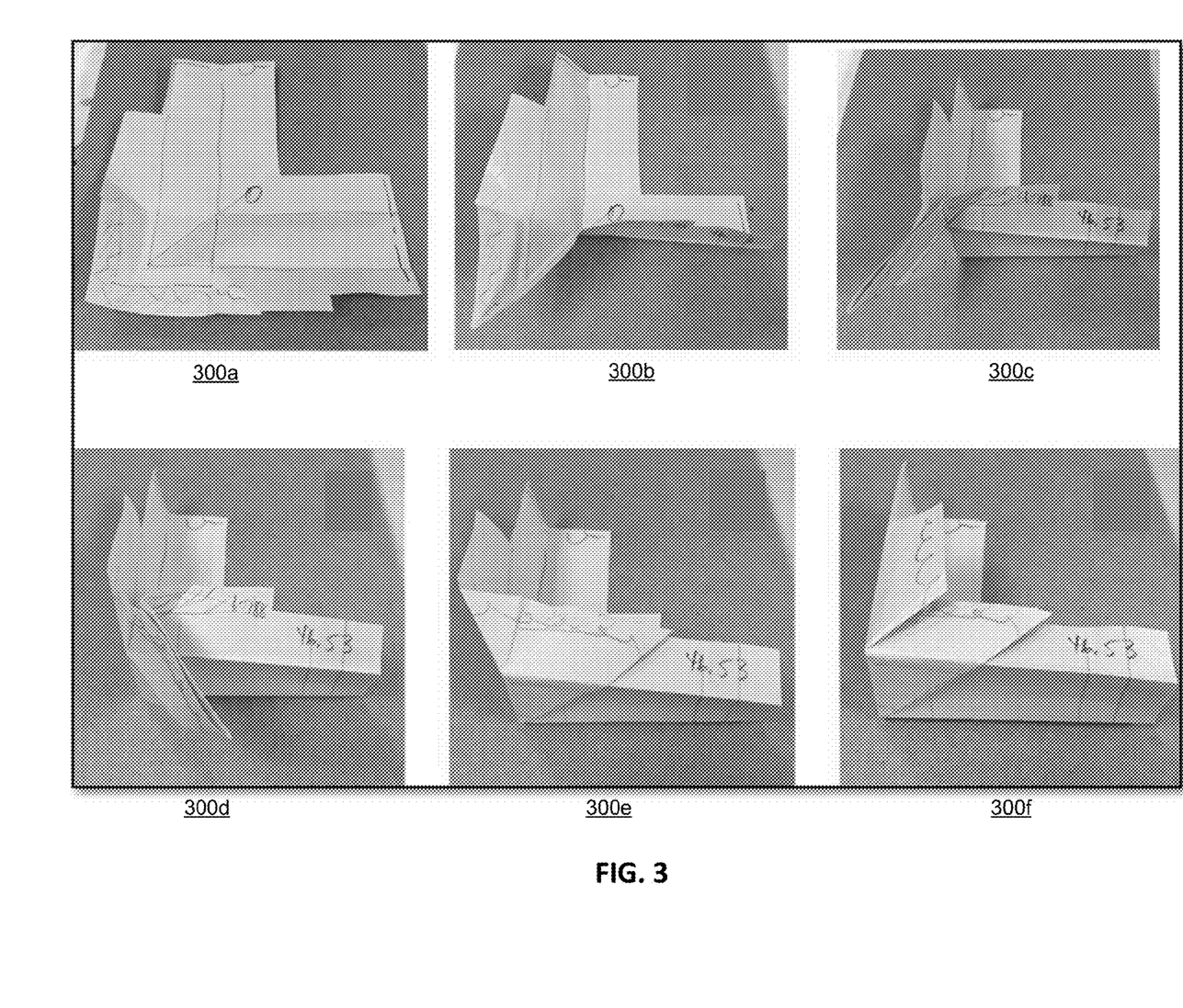
FIG. 3 illustrates perspective views of a series of actions to create a folded wrapping, in accordance with various embodiments.

FIG. 3 illustrates perspective views of a series of actions to create a folded wrapping, in accordance with various embodiments. Diagrams 300a-300f may illustrate specific folding actions in which the folded wrapping 120 may be folded into a volume. Diagram 300a may illustrate a corner of the folded wrapping 120 that may include folding lines. At diagram 300b, the lower part of the folded wrapping 120 may be folded upwards. At diagram 300c, the left portion of the folded wrapping 120 may be folded to the right. At diagram 300d, the resulting corner at the lower left may be folded to the right. At diagram of 300e, the resulting corner meets the lower part of the folded wrapping 120. At diagram 300f, the left portion of the folded wrapping may be folded to the right, resulting in a corner of a box-shaped volume.

Figure 4:
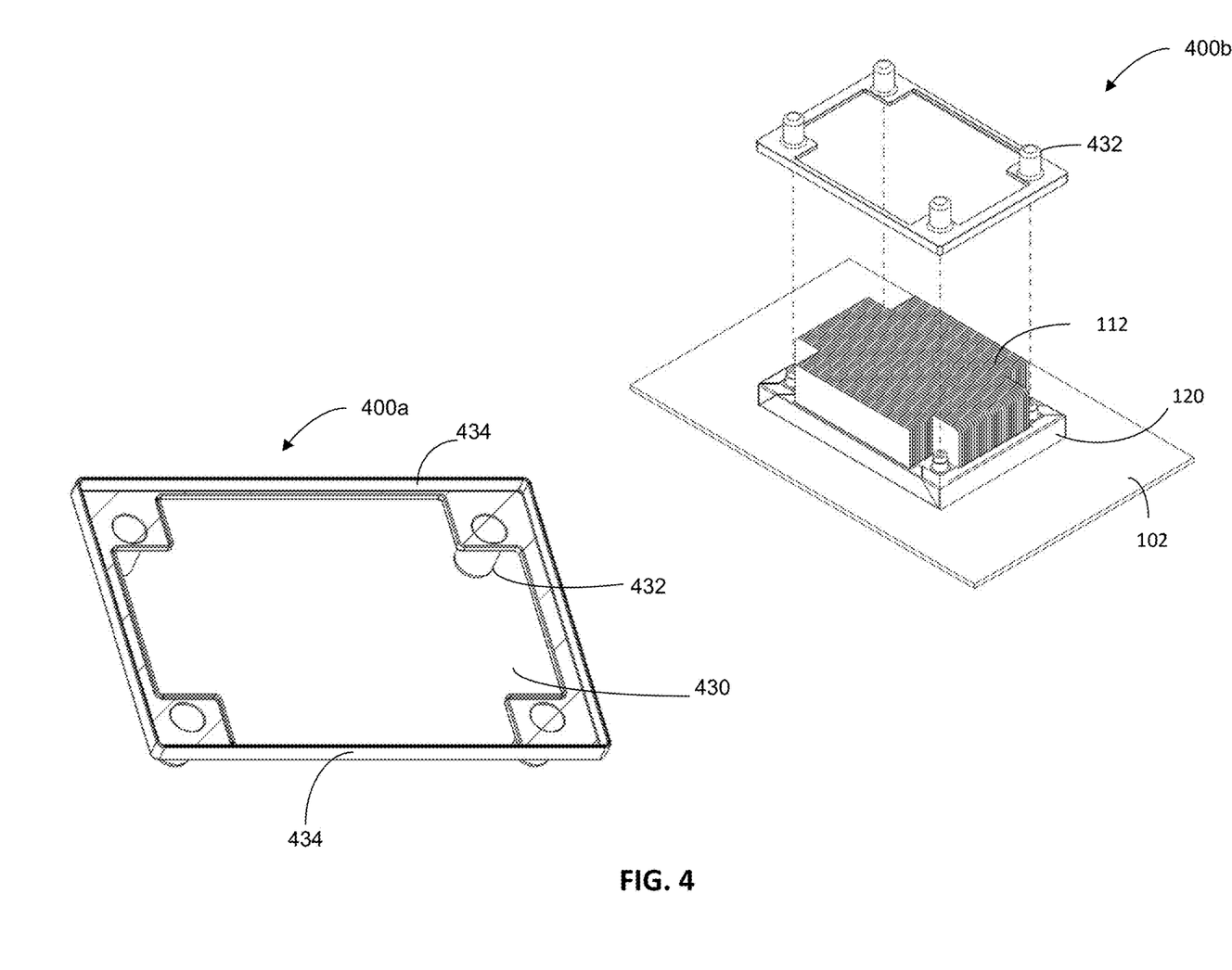
FIG. 4 is a bottom perspective and exploded view of a sealing cap, in accordance with various embodiments.

FIG. 4 is a bottom perspective and exploded view of a sealing cap, in accordance with various embodiments. Diagram 400a may be a bottom perspective view of a sealing cap, which may be similar to sealing cap 122 of FIG. 1. The sealing cap 400a may be adapted to specific heatsink 112 geometry and loading/retention assembly 106 designs. For example, cutout 430 may allow the sealing cap to be customized to clear heatsink fins 112a. Mounting hardware encapsulation features 432, which may be similar to encapsulation feature 122a of FIG. 1, may be adapted for spring-loaded mounting hardware, which may include, for example, pin 114. Sealant (not shown) may be dispensed into the encapsulation features 432. A retention flange 434, may cover the folded wrapping 120 where it meets the heatsink 120 to provide a coolant-tight seal. In embodiments, the retention flange 434 may be filled with sealant (not shown) to provide a secure seal.

The sealing cap 400a may be manufactured from materials compatible with coolant fluid, including but not limited to injection molded plastics, coated plastics, and die cast metals.

Figure 5:
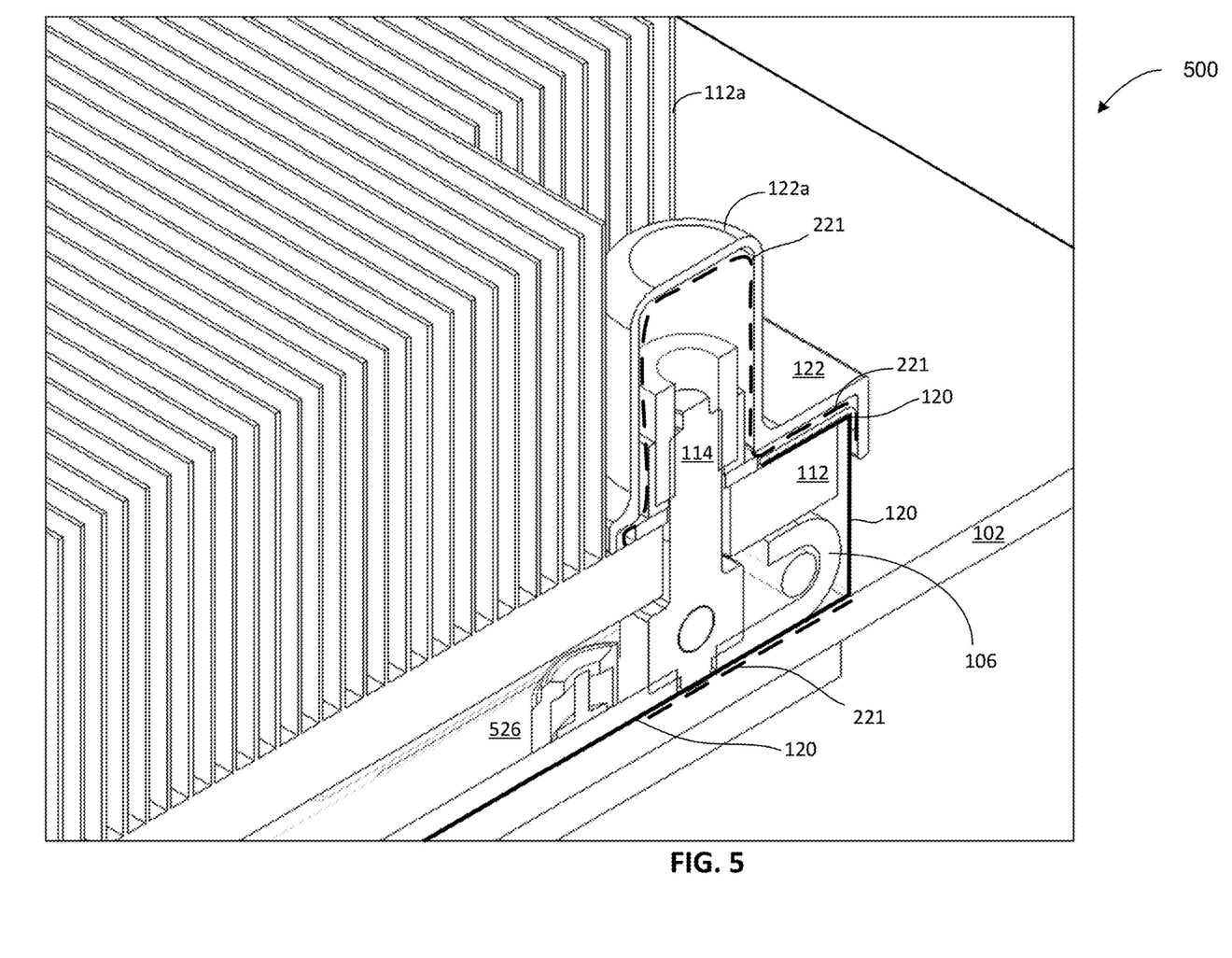
FIG. 5 is a cut away view of a circuit board, folded wrapping, and sealing cap, in accordance with various embodiments.

FIG. 5 is a cut away view of a circuit board, folded wrapping, and sealing cap, in accordance with various embodiments. Diagram 500 shows a loading/retention assembly 106 that may be attached to a heatsink 112 and a sealing cap 122. The heatsink 112 may have cooling fins 112a. The attachment may include pins 114 that may be contained within a sealing cap encapsulation feature 122a. The loading/retention assembly 106 may be coupled to the PCB 102. A folded wrapping 120 may be sealed to the PCB 102 using sealant 221. The folded wrapping 120 may wrap around the edge of the loading/retention assembly 106 and the outer edge and the top of the heatsink 112. The sealing cap 122, which may include the sealing cap encapsulation feature 122a and the sealant retention flange 434 of FIG. 4, may have sealant 221 applied.

After assembly, the volume 526, which may be enclosed by the PCB 102, heatsink 122, and folded wrapping 120 may not receive any coolant when the apparatus is immersed in coolant. In embodiments, the volume 526 may include the loading/retention assembly 106, the socket 104, the CPU 108, and/or TIM 110. In embodiments, other components may be included within the volume 526.

Figure 6:
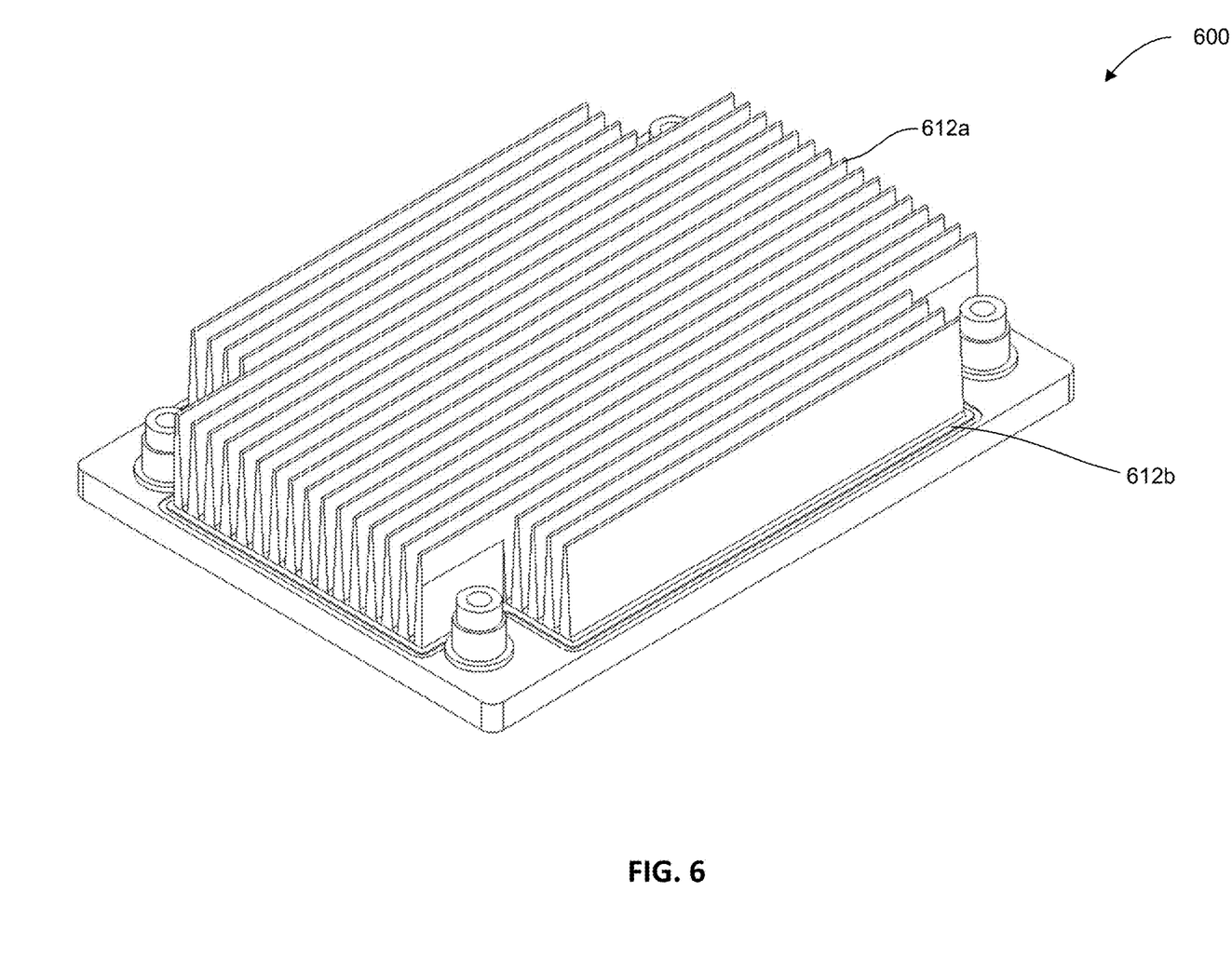
FIG. 6 illustrates in immersion-specific heatsink, in accordance with various embodiments.

FIG. 6 illustrates in immersion-specific heatsink, in accordance with various embodiments. Diagram 600 shows an immersion-specific heatsink that may be similar to heatsink 112a of FIG. 1. In embodiments, the immersion-specific heatsink 600 may be modified from heatsink 112a to increase thermal performance when used with immersion cooling. For example, the design of the immersion-specific heatsink 600 may be to maximize compute density by reducing size of heatsink and to take advantage of liquid cooling physical property advantages over air cooling. For example, fins 612a may be shorter or shaped differently than fins used for air cooling. Due to the higher density of fluid coolant than air coolant, the surface area necessary for sufficient heat transfer may be smaller than that needed for air cooled heatsinks. In addition, the shape of the fins 612a of the immersion-specific heatsink may be customized. For example, the shape of fins 612a may be a triangular cross section, wider and shorter than a similarly manufactured shape for air cooling. This may allow for a shorter overall profile of the heatsink and thus neighboring computing systems may be placed closer together resulting in a denser computing block. Alternately, the fin shape may be further optimized for more heat transfer with liquid cooling than with air cooling. For example, a longer, stacked fin structure may allow for more heat transfer, thus a higher power processor may be cooled in the same volume than air cooling otherwise may support. Heatsink fins may be optimized to achieve better pressure drop performance due to the density of immersion coolant fluids, changing the shape of the fins to, for example, an airfoil-like cross section while maintaining surface area for heat transfer in the coolant fluid medium. Fins may also be pin-fin style, rounded, square, or diamond-shaped, depending upon application, heat transfer requirements, performance requirements, and coolant fluid approach direction and velocity.

In addition, different materials for the heatsink 600 may be used, for example instead of using copper for air-cooled implementations, aluminum may be used to take advantage of the increased thermal characteristics present in a immersed liquid cooled system. The higher density of liquid coolant may allow a heatsink 600 to have a smaller surface area, or lower intrinsic material conductive properties, or both. Unlike an air sink that may require expensive and high-mass copper to sufficiently transfer the heat from the CPU's limited surface area to a fin bank, with fluid coolant the heat transfer coefficient from the fins may be great enough to use lower-cost, lower-mass aluminum for the heatsink 600.

There also may be cost savings by using lower-cost manufacturing techniques and materials, such as using aluminum and creating the heatsink 600 using an extruded profile, for example extruding the fins 612a and base as one unit, then performing secondary machining to hone final features. This may result in a faster and more economical manufacturing process for heatsinks 600. In addition, the immersion-specific heatsink may include features such as a seal groove 612b that may be compatible with using a folded wrapping 120 technique.

Figure 7:
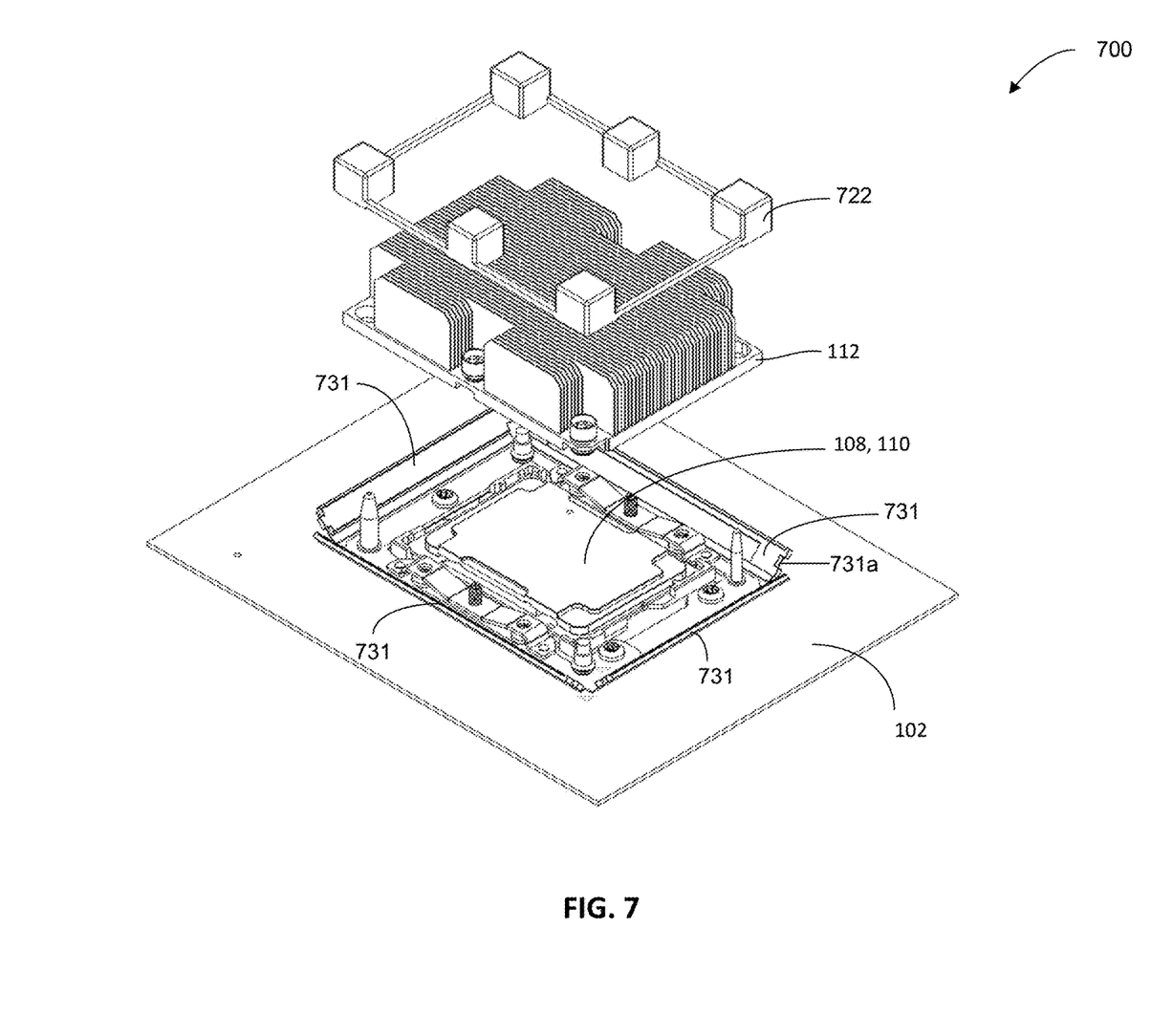
FIG. 7 is an exploded view of an extended sealing surface used with the folded wrapping, in accordance with various embodiments.

FIG. 7 is an exploded view of an extended sealing surface used with the folded wrapping, in accordance with various embodiments. FIG. 700 shows an explosion diagram that includes PCB 102, heatsink 112, CPU 108 and TIM 110. An extended sealing surface 731 is also included that may be fastened to the folded wrapping 120 (not shown here for clarity). The extended sealing surface 731 may be customized for the geometry of an existing heatsink 112, and may be made of plastic or metal frames. In embodiments, the extended ceiling surface 731 may contain features to approve assembly accuracy and sealing, for example interlocking tabs 731a.

In embodiments, the extended sealing surface may be pre-sealed to the folded wrapping 120 while a sealing cap 722, which may be similar to sealing cap 122 of FIG. 1, may be applied. In embodiments, the same sealant, such as sealant 221 of FIG. 5, may be used. In embodiments, the extended ceiling surfaces 731 may be sealed to the heatsink 112 and retained in place by the sealing cap 722. The extended sealing surfaces may be fastened to the folded wrapping 120 as part of manufacture, or may be fastened at a product integrator site.

Figure 8:
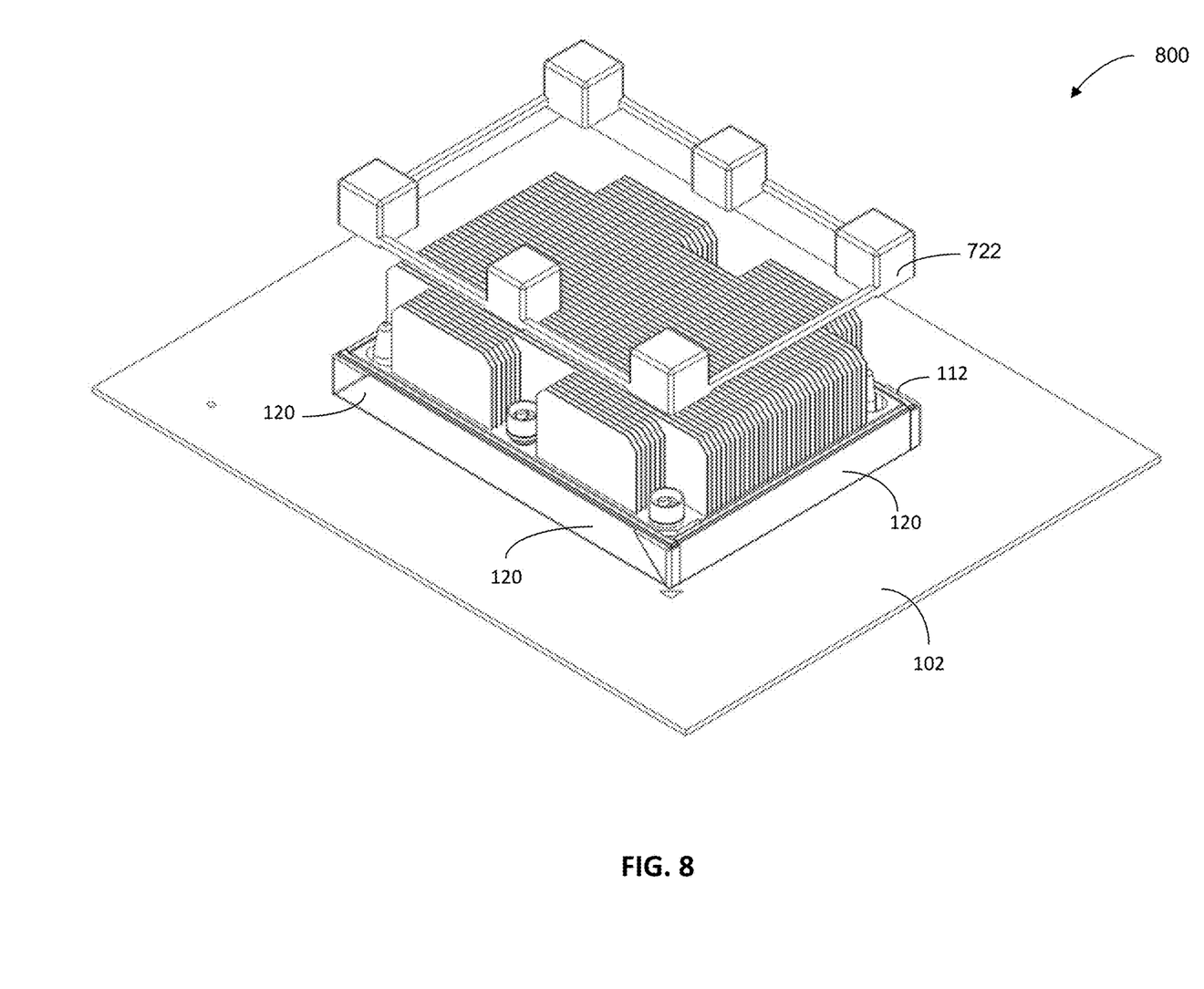
FIG. 8 is an exploded view of an alternate version of a sealing cap used with extended sealing services, in accordance with various embodiments.

FIG. 8 is an exploded view of an alternate version of a sealing cap used with extended sealing services, in accordance with various embodiments. Diagram 800 may include PCB 102, folded wrapping 120, that may be attached to an extended sealing surface (not shown), but which may be similar to extended sealing surface 731 of FIG. 7. Sealing cap 722 may be placed on heatsink 112 such that the sealing cap 722 will overlap the edge of the folded wrapping 120 that is supported by the extended sealing surface (not shown). A sealant, such as sealant 221 of FIG. 5, may be placed between the sealing cap 722 and the folded wrapping 120 so that a coolant-tight seal may be achieved.

Figure 9:
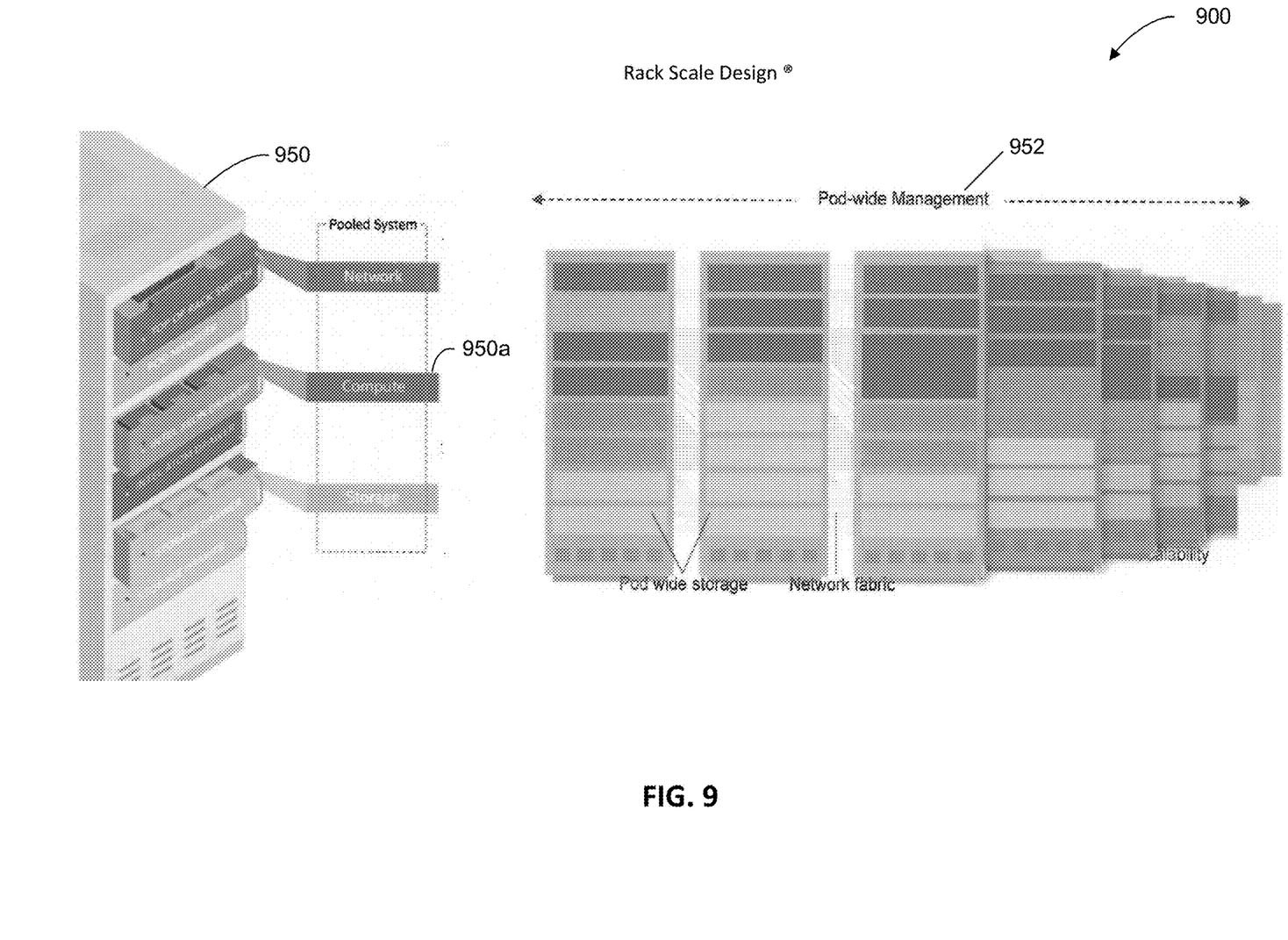
FIG. 9 is an example rack systems architecture framework into which the mechanism to seal components immersed in coolant may be installed, in accordance with various embodiments.

FIG. 9 is an example rack systems architecture framework into which the mechanism to seal components cooled with immersion coolant may be installed, in accordance with various embodiments. Diagram 900 includes a high-level schematic of Intel® Rack Scale Design™. In embodiments, one or more racks 950 may be joined into a Pod 952, which may be efficiently managed using additional hardware and software (not shown), which may use open standards such as the RESTful API standard or open-sourced RSD reference software. In embodiments, a drawer 950a, which may be a rack 950 location, may include one of a plurality of computing apparatuses, e.g., a computer resource, a network resource, or a storage resource. One or more of the computing apparatuses/resources may include electronic components, circuit board and heatsink enclosed/sealed using folded wrapping 120 and/or sealing cap 122 as described above, enabling the assembly to be immersion cooled, while the overall rack is generally air cooled, without substantially increasing the risk of the enclosed/sealed components being susceptible to corrosion by direct exposure to coolant, that may lead to performance degradation.

Figure 10:
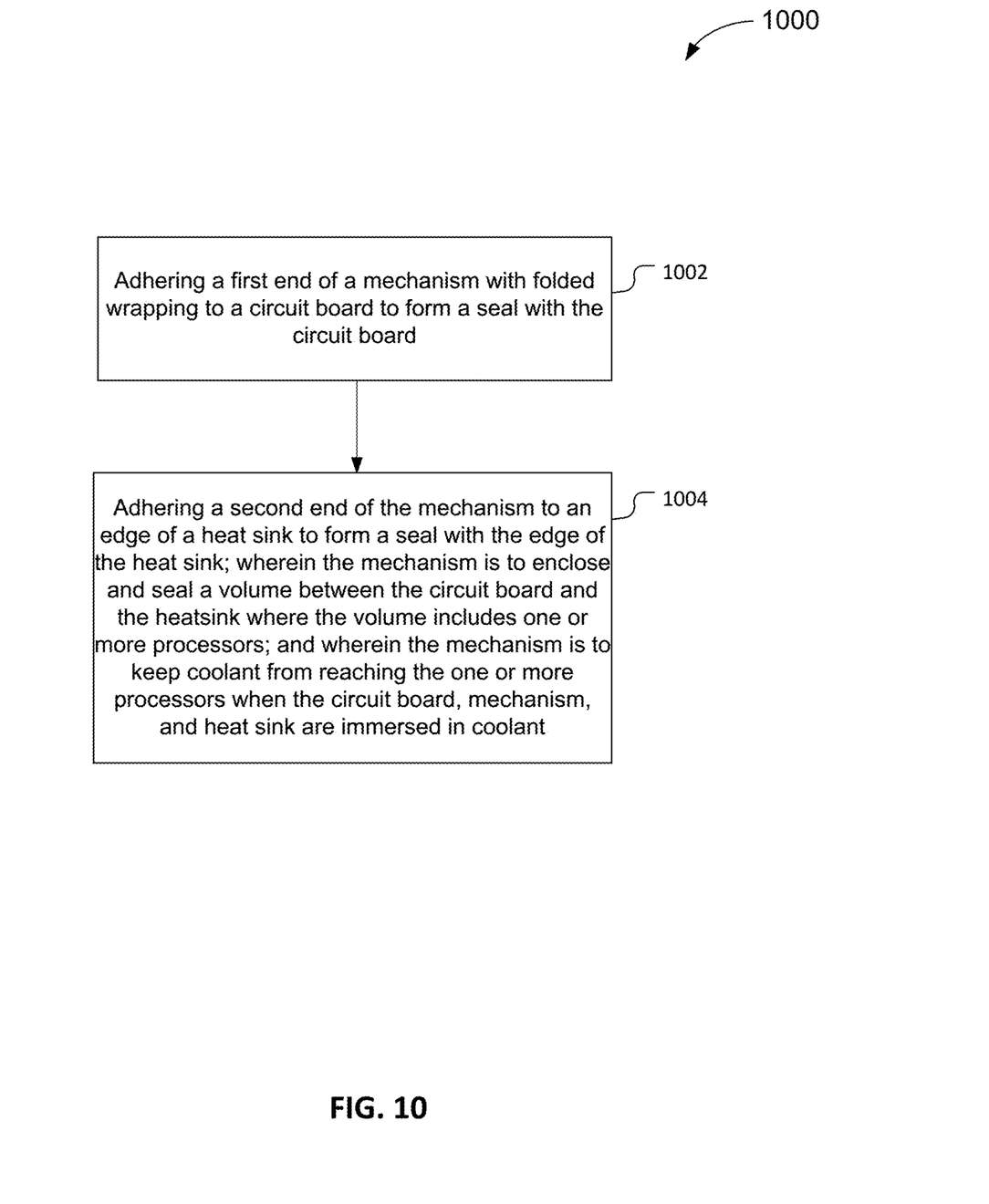
FIG. 10 is a block diagram of a process for sealing a component to be immersed in coolant, in accordance with various embodiments.

FIG. 10 is a block diagram of a process for sealing a component to be immersed in coolant, in accordance with various embodiments. In embodiments, the process may be implemented using the techniques and components described in FIGS. 1-8.

At block 1002, the process may include adhering a first end of a mechanism with folded wrapping to a circuit board to form a seal with the circuit board. This may include adhering one end of the folded wrapping 102a to the PCB 102 using sealant 221. The area 220d of the folded wrapping 220 may correspond to the location of the loading/retention mechanism 106.

At block 1004, the process may include adhering a second end of the mechanism to an edge of a heatsink to form a seal with the edge of the heatsink; wherein the mechanism is to enclose and seal a volume between the circuit board and the heatsink where the volume includes one or more processors; and wherein the mechanism is to keep coolant from reaching the one or more processors when the circuit board, mechanism, and heatsink are immersed in coolant. This may include folding the folded wrapping 120 around the heatsink 112, and may include securing the folded wrapping 120 using a sealing cap 122 in conjunction with sealant 221.

Various operations are described as multiple discrete operations in turn, in a manner that is most helpful in understanding the claimed subject matter. However, the order of description should not be construed as to imply that these operations are necessarily order dependent.

Examples

Example 1 is an apparatus, comprising: a mechanism with a folded wrapping to mate with a circuit board and a heatsink to enclose and seal a volume between the circuit board and the heatsink; wherein the mechanism with the folded wrapping is dimensioned to enclose and seal the volume with the volume having a size to accommodate one or more processors to be disposed within the volume, electrically coupled to the circuit board and thermally coupled to the heatsink; and wherein on enclosing and sealing the volume, the mechanism with the folded wrapping prevents coolant from reaching the one or more processors.

Example 2 is the apparatus of the example 1, wherein the folded wrapping has geometries complementary to geometries of the heatsink.

Example 3 is the apparatus of example 1, wherein the folded wrapping is made of plastic polymers, metal foils, or coated polymer.

Example 4 is the apparatus of any one of examples 1-3, further comprising a sealing cap dimensioned to be secured over a top of the heatsink to overlap an edge surrounding the heatsink, wherein an opening of the mechanism is secured under the sealing cap to form a seal with the heatsink.

Example 5 is the apparatus of example 4, further comprising the circuit board, the one or more processors, and the heatsink.

Example 6 is the apparatus of example 5, further comprising adhesive sealant disposed between an opening of the mechanism and the circuit board.

Example 7 is the apparatus of example 5, further comprising adhesive sealant disposed between an opening of the mechanism and an edge surrounding the heatsink.

Example 8 is the apparatus of any one of examples 1-3, further comprising the circuit board, the one or more processors, the heatsink, a sealing cap, and adhesive sealant disposed between the opening of the mechanism with the folded wrapping and the sealing cap, wherein the sealing cap is dimensioned to be secured over a top of the heatsink to overlap an edge surrounding the heatsink, wherein an opening of the mechanism with the folded wrapping is secured under the sealing cap to form a seal with the heatsink.

Example 9 is the apparatus of any one of examples 1-3, wherein the mechanism with the folded wrapping is dimensioned to enclose and seal the volume, with the volume having a size to further accommodate a thermal interface material (TIM), package sealant, or socket.

Example 10 is a method, comprising: adhering a first end of a mechanism with folded wrapping to a motherboard to form a seal with the motherboard; adhering a second end of the mechanism with the folded wrapping to an edge of a heatsink to form a seal with the edge of the heatsink; wherein the mechanism with the folded wrapping is to enclose and seal a volume between the motherboard and the heatsink where the volume includes one or more processors; and wherein the mechanism with the folded wrapping prevents coolant from reaching the one or more processors.

Example 11 is the method of example 10, further comprising folding the folded wrapping to a geometry complementary to geometries of the heatsink.

Example 12 is the method of example 10, wherein the folded wrapping is made of plastic polymers, metal foils, or coated polymer.

Example 13 is the method of any one of examples 10-12, further comprising securing a sealing cap on a top of the heatsink to overlap an edge surrounding the heatsink, wherein an opening of the folded wrapping is secured under the sealing cap to form a seal with the heatsink.

Example 14 is a system, comprising: a circuit board; a heatsink; and a mechanism with a folded wrapping to mate with a circuit board and a heatsink to enclose and seal a volume between the circuit board and the heatsink; wherein the mechanism with the folded wrapping is dimensioned to enclose and seal the volume with the volume having a size to accommodate one or more processors to be disposed within the volume, electrically coupled to the circuit board and thermally coupled to the heatsink; and wherein on enclosing and sealing the volume, the mechanism with the folded wrapping prevents coolant from reaching the one or more processors.

Example 15 is the system of example 14, wherein the folded wrapping has geometries complementary to geometries of the heatsink.

Example 16 is the system of example 14, wherein the folded wrapping is made of plastic polymers, metal foils, or coated polymer.

Example 17 is the system of any one of examples 14-16, further comprising a sealing cap dimensioned to be secured over a top of the heatsink to overlap an edge surrounding the heatsink, wherein an opening of the mechanism is secured under the sealing cap to form a seal with the heatsink.

Example 18 is the system of example 17, further comprising the circuit board, the one or more processors, and the heatsink.

Example 19 is the system of any one of example 14-16, further comprising the circuit board, the one or more processors, the heatsink, a sealing cap, and adhesive sealant disposed between the opening of the mechanism with the folded wrapping and the sealing cap, wherein the sealing cap is dimensioned to be secured over a top of the heatsink to overlap an edge surrounding the heatsink, wherein an opening of the mechanism with the folded wrapping is secured under the sealing cap to form a seal with the heatsink.

Example 20 is the system of any one of examples 14-16, wherein the mechanism with the folded wrapping is dimensioned to enclose and seal the volume, with the volume having a size to further accommodate a thermal interface material (TIM), package sealant, or socket.

Example 21 is the system of any one of examples 14-16, further including at least one of a central processing unit (CPU), CPU package, socket, loading/retention mechanism, or thermal interface material (TIM).

Example 22 is an apparatus, comprising: means for adhering a first end of a mechanism with folded wrapping to a motherboard to form a seal with the motherboard; means for adhering a second end of the mechanism with the folded wrapping to an edge of a heatsink to form a seal with the edge of the heatsink; wherein the mechanism with the folded wrapping is to enclose and seal a volume between the motherboard and the heatsink where the volume includes one or more processors; and wherein the mechanism with the folded wrapping prevents coolant from reaching the one or more processors.

Example 23 is the apparatus of example 22, further comprising means for folding the folded wrapping to a geometry complementary to geometries of the heatsink.

Example 24 is the apparatus of example 22, wherein the folded wrapping is made of plastic polymers, metal foils, or coated polymer.

Example 25 is the apparatus of any one of examples 22-24, further comprising means for securing a sealing cap on a top of the heatsink to overlap an edge surrounding the heatsink, wherein an opening of the folded wrapping is secured under the sealing cap to form a seal with the heatsink.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. An apparatus, comprising:
a mechanism with a folded wrapping to mate with a circuit board and a heatsink to enclose and seal a volume between the circuit board and the heatsink;
wherein the mechanism with the folded wrapping is dimensioned to enclose and seal the volume with the volume having a size to accommodate one or more processors to be disposed within the volume, electrically coupled to the circuit board and thermally coupled to the heatsink; and
wherein on enclosing and sealing the volume, the mechanism with the folded wrapping prevents coolant from reaching the one or more processors.

2. The apparatus of claim 1, wherein the folded wrapping has geometries complementary to geometries of the heatsink.

3. The apparatus of claim 1, wherein the folded wrapping is made of plastic polymers, metal foils, or coated polymer.

4. The apparatus of claim 1, further comprising a sealing cap dimensioned to be secured over a top of the heatsink to overlap an edge surrounding the heatsink, wherein an opening of the mechanism is secured under the sealing cap to form a seal with the heatsink.

5. The apparatus of claim 1, further comprising adhesive sealant disposed between an opening of the mechanism and the circuit board.

6. The apparatus of claim 1, further comprising adhesive sealant disposed between an opening of the mechanism and an edge surrounding the heatsink.

7. The apparatus of claim 1, further comprising the circuit board, the one or more processors, the heatsink, a sealing cap, and adhesive sealant disposed between an opening of the mechanism with the folded wrapping and the sealing cap, wherein the sealing cap is dimensioned to be secured over a top of the heatsink to overlap an edge surrounding the heatsink, wherein the opening of the mechanism with the folded wrapping is secured under the sealing cap to form a seal with the heatsink.

8. The apparatus of claim 1, wherein the mechanism with the folded wrapping is dimensioned to enclose and seal the volume, with the volume having a size to further accommodate a thermal interface material (TIM), package sealant, or socket.

9. A method, comprising:
adhering a first end of a mechanism with folded wrapping to a motherboard to form a seal with the motherboard;
adhering a second end of the mechanism with the folded wrapping to an edge of a heatsink to form a seal with the edge of the heatsink;
wherein the mechanism with the folded wrapping is to enclose and seal a volume between the motherboard and the heatsink where the volume includes one or more processors; and
wherein the mechanism with the folded wrapping prevents coolant from reaching the one or more processors.

10. The method of claim 9, further comprising folding the folded wrapping to a geometry complementary to geometries of the heatsink.

11. The method of claim 9, wherein the folded wrapping is made of plastic polymers, metal foils, or coated polymer.

12. The method of claim 9, further comprising securing a sealing cap on a top of the heatsink to overlap an edge surrounding the heatsink, wherein an opening of the folded wrapping is secured under the sealing cap to form a seal with the heatsink.

13. A system, comprising:
a circuit board;
a heatsink; and
a mechanism with a folded wrapping to mate with a circuit board and a heatsink to enclose and seal a volume between the circuit board and the heatsink;
wherein the mechanism with the folded wrapping is dimensioned to enclose and seal the volume with the volume having a size to accommodate one or more processors to be disposed within the volume, electrically coupled to the circuit board and thermally coupled to the heatsink; and
wherein on enclosing and sealing the volume, the mechanism with the folded wrapping prevents coolant from reaching the one or more processors.

14. The system of claim 13, wherein the folded wrapping has geometries complementary to geometries of the heatsink.

15. The system of claim 13, wherein the folded wrapping is made of plastic polymers, metal foils, or coated polymer.

16. The system of claim 13, further comprising a sealing cap dimensioned to be secured over a top of the heatsink to overlap an edge surrounding the heatsink, wherein an opening of the mechanism is secured under the sealing cap to form a seal with the heatsink.

17. The system of claim 13, further comprising the circuit board, the one or more processors, the heatsink, a sealing cap, and adhesive sealant disposed between an opening of the mechanism with the folded wrapping and the sealing cap, wherein the sealing cap is dimensioned to be secured over a top of the heatsink to overlap an edge surrounding the heatsink, wherein the opening of the mechanism with the folded wrapping is secured under the sealing cap to form a seal with the heatsink.

18. The system of claim 13, wherein the mechanism with the folded wrapping is dimensioned to enclose and seal the volume, with the volume having a size to further accommodate a thermal interface material (TIM), package sealant, or socket.

19. The system of claim 13, further including at least one of a central processing unit (CPU), CPU package, socket, loading/retention mechanism, or thermal interface material (TIM).

20. An apparatus, comprising:
   means for adhering a first end of a mechanism with folded wrapping to a motherboard to form a seal with the motherboard;
   means for adhering a second end of the mechanism with the folded wrapping to an edge of a heatsink to form a seal with the edge of the heatsink;
   wherein the mechanism with the folded wrapping is to enclose and seal a volume between the motherboard and the heatsink where the volume includes one or more processors; and
   wherein the mechanism with the folded wrapping prevents coolant from reaching the one or more processors.

21. The apparatus of claim 20, further comprising means for folding the folded wrapping to a geometry complementary to geometries of the heatsink.

22. The apparatus of claim 20, wherein the folded wrapping is made of plastic polymers, metal foils, or coated polymer.

23. The apparatus of claim 20, further comprising means for securing a sealing cap on a top of the heatsink to overlap an edge surrounding the heatsink, wherein an opening of the folded wrapping is secured under the sealing cap to form a seal with the heatsink.

\* \* \* \* \*